United States Patent [19]
Daikoku et al.

[11] Patent Number: 5,126,829
[45] Date of Patent: Jun. 30, 1992

[54] COOLING APPARATUS FOR ELECTRONIC DEVICE

[75] Inventors: Takahiro Daikoku, Ushiku; Nobuo Kawasaki, Ibaraki; Noriyuki Ashiwake, Tsuchiura; Shizuo Zushi, Hadano, all of Japan

[73] Assignee: Hitachi, Ltd., Tokyo, Japan

[21] Appl. No.: 412,130

[22] Filed: Sep. 25, 1989

[30] Foreign Application Priority Data

Sep. 26, 1988 [JP] Japan .................. 63-238721

[51] Int. Cl.⁵ .......................................... H01L 25/04
[52] U.S. Cl. ...................................... 357/82; 357/74; 357/75; 357/80; 357/81
[58] Field of Search .................. 357/74, 75, 80, 81, 357/82

[56] References Cited

U.S. PATENT DOCUMENTS

| | | | |
|---|---|---|---|
| 4,233,645 | 11/1980 | Balderes et al. | 361/385 |
| 4,567,205 | 10/1983 | Pease et al. | 357/81 |
| 4,567,505 | 1/1986 | Pease et al. | 357/381 |
| 4,621,304 | 11/1986 | Oagaki et al. | 361/386 |
| 4,639,829 | 1/1987 | Ostergren | 357/82 |
| 4,761,518 | 8/1988 | Butt | 357/74 |

FOREIGN PATENT DOCUMENTS

| | | |
|---|---|---|
| 2729074 | 3/1976 | Fed. Rep. of Germany . |
| 60-126852 | 7/1985 | Japan . |
| 61-75137 | 5/1986 | Japan . |
| 62-268148 | 1/1987 | Japan . |

OTHER PUBLICATIONS

IBM Technical Disclosure Bulletin, Circuit Package with Spring-Loaded Pistons Holding Cooling Plate Against Chip and with Flexible Material Holding Cooling Plates and Sealing Chips from a Cooling Fluid, vol. 28 No. 7 Dec. 1985, pp. 3066-3067.

*Primary Examiner*—Eugene R. LaRoche
*Assistant Examiner*—R. A. Ratliff
*Attorney, Agent, or Firm*—Antonelli, Terry, Stout & Kraus

[57] ABSTRACT

A cooling apparatus for an electronic device makes a cooling solid body in contact with the electronic device so as to cool the electronic device. The apparatus has a high viscous thermal conductive fluid provided on a heat transfer portion of the electronic device, and a cooling solid body in close contact through the thermal conductive fluid with the heat transfer portion of the electronic device. The close contact portion of at least one of the cooling solid body and the electronic device has multiple grooves open to the outside of the one of the cooling solid body and the electronic device.

17 Claims, 8 Drawing Sheets

COOLING APPARATUS FOR ELECTRONIC DEVICE

BACKGROUND OF THE INVENTION

1. Field of the Invention

The present invention relates to a cooling apparatus of an electronic device e.g. a semiconductor chip, a chip module containing a single semiconductor chip and a multichip module containing multiple semiconductor chips.

2. Description of the Related Art

Japanese Patent Application Laid-open No. 62-268148 disclose a prior-art device for cooling a semiconductor chip by contact through a thermal conductive material with a cooling solid body.

U.S. Pat. No. 4,567,505 as illustrated in FIG. 1 discloses a prior-art arrangement in which a liquid e.g. silicon oil, readily wetting and spreading over the surface of a solid body is sandwiched between a heat transfer surface of a cooling solid body, which surface defines multiple microgrooves in the form of a so-called re-entrant structure with a narrower entrance and a divergent portion extending to the bottom of each of the microgrooves and a flat heat transfer surface of a semiconductor chip constituting a heating element, so that the surface tension of the liquid brings said two heat transfer surfaces into close contact with each other so as to reduce a contact thermal resistance therebetween.

The former publications fails to teach that the thickness of a layer of the thermal conductive material sandwiched between the semiconductor chip and the cooling solid body is reduced in order to increase the thermal conductance of the layer or to provide any suggestion of an electronic device in the form of a multichip module containing multiple semiconductor chips.

In the case of the cooling structure disclosed in U.S. Pat. No 4,567,505, only the surface tension of the liquid draws the cooling solid body to the semiconductor device, so that when the heat transfer surface of either of the cooling solid body or the semiconductor device has a warp, a rigidness of the cooling solid body or the semiconductor device prevents any possiblity of rectifying the warp by means of the draw force of the liquid and thus the thickness of the liquid layer between said two heat transfer surfaces cannot be maintained constant. That is, since there is no external force restraining a deformation in the heat transfer surfaces, the thickness of the liquid layer is changed due to the magnitude of the warp in the contacted heat transfer surfaces. Thus, the contact thermal resistance between the contacted heat transfer surfaces will not be kept constant.

On the other hand, when the cooling solid body which has been drawn to the semiconductor device is going to be separated from the semiconductor, the liquid is drawn to the entrance of the re-entrant groove and the radius of curvature of the concave surface of the liquid is much reduced as the cooling solid body separates from the semiconductor. Consequently, the pressure of the liquid decreases to below the surrounding pressure and the draw force of the liquid increases. Thereby, a required separation force must increase. If the separation force is reduced, then the draw force of the liquid will decrease, so that the contact thermal resistance will not be reduced. On the other hand, if the draw force of the liquid is increased, then the semiconductor device itself and/or an electric connection to the semiconductor device will experience damage when the cooling solid body is separated from the semiconductor device.

As described above, the prior art fails to teach that a bearing pressure between the contact surfaces is maintained low and a cooling power is concurrently increased, and a separation of the cooling solid body from an object to be cooled concurrently is easy.

SUMMARY OF THE INVENTION

A primary object of the present invention is to provide a cooling apparatus of an electronic device for improving its thermal conductivity so as to efficiently cool the electronic device.

Another object of the present invention is to provide an efficient cooling apparatus of a multichip module type electronic device containing multiple semiconductor chips.

A further object of the present invention is to provide a cooling apparatus for an electronic device in which apparatus a uniformly thin layer made of a thermal conductive fluid is sandwiched between the electronic device and a cooling solid body.

A still further object of the present invention is to provide a cooling apparatus for an electronic device in which apparatus a uniformly thin layer made of a thermal conductive grease is sandwiched between the electronic device and the cooling solid body without applying a high, pressure to the electronic device.

A further object of the present invention is to provide a cooling apparatus for an electronic device of which apparatus manufacturing, assembly and disassembly are easy and which apparatus has a good cooling power.

A still further object of the present invention is to provide a cooling apparatus for an electronic device which apparatus maintains bearing pressure between the electronic device and the cooling solid body to be low, concurrently increases a cooling power and easily separates the cooling solid body from the electronic device.

In order to achieve the above objects, the first aspect of the present invention comprises: an electronic device; a cooling solid body eliminating heat produced by the electronic device; thermal conductive fluid with high thermal conductivity sandwiched between a heat transfer surface of the electronic device and a heat transfer surface of the cooling solid body; and clamping means for making the cooling solid body in close contact with the electronic device, the heat transfer surface of at least one of the electronic device and the cooling solid body defining multiple grooves communicating with space surrounding the heat transfer surface.

The second aspect of the present invention is characterized in that a cooling apparatus for an electronic device has an arrangement in which an external force makes a cooling solid body in close contact with a heat transfer surface of the electronic device to which surface a thermal conductive fluid with a high thermal conductivity and hardly wetting the surface of a solid is applied, so that the arrangement cools the electronic device, and that one of the heat transfer surfaces of the electronic device and the cooling solid body is flat and the other is a grooved surface including a flat heat transfer surface and multiple grooves defined on the flat heat transfer surface and communicating with the outside of the grooved heat transfer surface, and the capacity of the grooves is larger than the volume of the thermal conductive fluid applied to between adjacent ones of the grooves.

The third aspect of the present invention is characterized in that a cooling apparatus for the electronic device comprises: a cooling solid body in close contact through thermal conductive fluid with high thermal conductivity with a heat transfer surface of an electronic device; and two heat transfer surfaces of the electronic device and the cooling solid body, one of the heat transfer surfaces having multiple grooves communicating with the outside of the heat transfer surfaces, the capacity of the grooves being larger than the volume of thermal conductive fluid sandwiched between the heat transfer surfaces so that the grooves leaves therein space communicating with the outside when the thermal conductive fluid is received within the grooves.

The fourth aspect of the present invention is characterized in that a cooling apparatus for the electronic device comprises: an electronic device to be cooled; thermal conductive fluid provided on a heat transfer portion of the electronic device; and a cooling solid body in close contact through the thermal conductive fluid with the heat transfer portion of the electronic device, the cooling solid body having at the close contact portion multiple grooves communicating with the outside of the cooling solid body.

The fifth aspect of the present invention is characterized in that a cooling apparatus for the electronic device comprises: an electronic device of which a package contains a plurality of semiconductor chips; a cooling solid body eliminating heat produced by the electronic device; a thermal conductive fluid with a high thermal conductivity sandwiched between the overall heat transfer surface of the electronic device and a heat transfer surface of the cooling solid body; clamping means for making the cooling solid body in close contact with the electronic device The sixth aspect of the present invention is characterized in that a cooling apparatus for an electronic device comprises: a multichip module in which a ceramic package hermetically seals a ceramic multilayer interconnection substrate with multiple LSI chips packaged thereon and flexible thermal conductive contractors transmits heat produced by the LSI chips to the ceramic package; a water-cooled jacket in close contact through a thermal conductive fluid with a high thermal conductivity and viscosity with the overall surface of a heat transfer portion of the multichip module, water passing through the interior of the water-cooled jacket; and means for making the water-cooled jacket in close contact with the multichip module in order to sandwich a thin layer made of the thermal conductive fluid between the water-cooled jacket and the multichip module.

The other aspects, objects and advantages of the present invention will be apparent from the following description with reference to the drawings.

DESCRIPTION OF THE PREFERRED EMBODIMENTS

Figure 1:
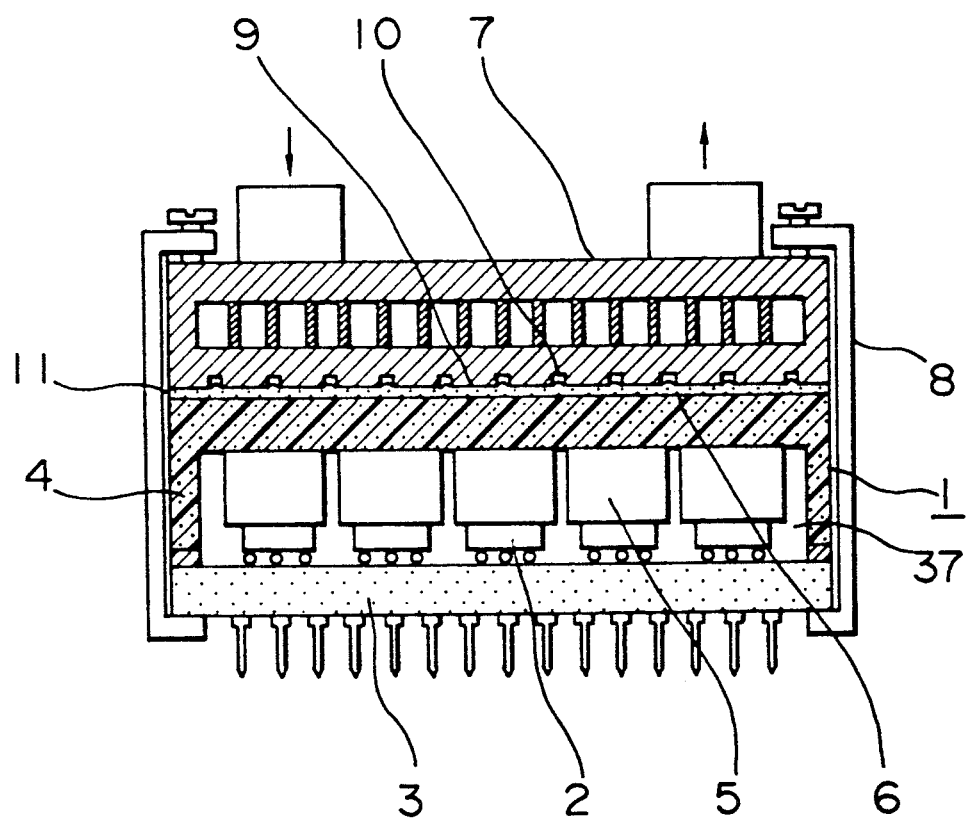
FIG. 1 is a vertical sectional view through a cooling apparatus of an electronic device of an embodiment according to the present invention.

It is advantageous to a cooling apparatus for an electronic device that between the electronic device and a cooling solid body is sandwiched a thermal conductive grease and a possible air layer is eliminated therebetween in order to improve the thermal conductance between the electronic device and the cooling solid body. In order to further improve the cooling power of the cooling apparatus for the electronic device, fine particles of zinc oxide or high thermal conductive ceramic material are preferably mixed with the thermal conductive grease so as to increase the thermal conductivity of the resulting mixture, and high pressure produced in the manner of fastening with a bolt and the like preferably clamps the electronic device and the cooling solid body so that a layer of the thermal conductive grease spreads as thinly as possible and bubbles will not remain in the layer of the thermal conductive grease.

If the layer made of the thermal conductive grease and sandwiched between two flat heat transfer surfaces is to be made thin in order to reduce contact heat resistance therebetween, then a great bearing pressure must be applied to the heat transfer surfaces. In particular, when the areas of the heat transfer surfaces increase, the distance for flowing an excessive thermal conductive grease out of the heat transfer surfaces increases, and a greater bearing pressure must be required. Since a high thermal conductive grease includes fine particles of a high thermal conductive material at a high density in order to increase the thermal conductivity thereof, the high thermal conductive grease has a very great coefficient, of viscosity and is, able to wet the surface of a solid only with difficulty. Therefore, a great bearing pressure must be applied to the heat transfer surfaces sandwiching the high thermal conductive grease therebetween so as not to leave bubbles in the high thermal conductive grease and to produce a uniformly thin layer of the high thermal conductive grease. Thus, since in the case of, an electronic device e.g. a semiconductor chip made of a silicon crystal or semiconductor package made of alumina $Al_2O_3$, aluminum nitride AlN or high thermal conductive silicon carbide SiC, the mechanical strength of each of these materials is much lower than that of a metal and the mechanical strength of an electric connection provided on such electronic device is low, an application of large bearing pressure may damage the electronic device. Bolting the cooling solid body through a female screw defined in the semiconductor package locally causes a high stress in a surrounding portion near the female screw, which may break down the electronic device.

On the other hand, when the electronic device which has been mounted to the cooling solid body fails, the cooling solid body must be separated from the electronic device. However, when these two solid bodies which have been once brought into close contact with each other will be separated from each other, the thermal conductive grease will not be easily divided A large force of separating the cooling solid body from the electronic device will damage the electronic device itself, a mount and support therefor or an electric connection to the electronic device. In view of preventing the damage, it is neither possible to reduce the thickness of the layer of the thermal conductive grease nor to increase the heat transfer surfaces.

Therefore, the present invention has an arrangement in which the high thermal conductive fluid which is able to wet the surface of a solid only with difficulty is applied to one of two flat heat transfer surfaces of the electronic device and the cooling solid body, the other heat transfer surface having multiple grooves communicating with the outside of the other heat transfer surface, and the capacity of the grooves is so large as to leave space communicating with the outside of the other heat transfer surface even when the high thermal conductive fluid applied to a portion of the other heat transfer surface defined between adjacent grooves is pushed into the adjacent grooves.

Thus, one of the two flat heat transfer surfaces of the electronic device and the cooling solid body defines the multiple grooves, so that the portion of the one heat transfer surface defined between the adjacent grooves has a narrow width. When a heat transfer surface with a groove pitch $\lambda$ is in close contact with and pressed on a heat transfer surface having a layer of a high thermal conductive fluid with an initial application thickness $\delta$, the internal pressure of the high thermal conductive fluid is boosted and the high thermal conductive fluid flows into the grooves. In this state, the contact surfaces of the layer of the high thermal conductive fluid receive shearing force $\tau_W$ so that bearing pressure $W$ between the heat transfer surfaces flowing the high thermal conductive fluid is expressed by the following inequality:

$$W > \tau_W \cdot \frac{\lambda}{\delta} \qquad (1)$$

As can be understood from the inequality (1), as the groove pitch $\lambda$ is reduced, the bearing pressure $W$ can be reduced. Since the capacity of the grooves is so large that each of the grooves leaves therein space communicating with the outside of the grooves when the high thermal conductive fluid applied to a portion of the heat transfer surface defined between adjacent grooves is pushed into the adjacent grooves, a division operation caused by each of the grooves will not be blocked. In addition, as the high thermal conductive fluid is pushed out into the grooves, bubbles included in the layer of the high thermal conductive fluid are entrained into the grooves and escape out of the grooves. Thus, the low bearing pressure $W$ can allow the layer, of the high thermal conductive fluid between the opposite heat transfer surfaces to be thin, so that the contact thermal resistance between the electronic device and cooling solid body can be maintained low and stable.

On the other hand, when the electronic device is separated from the cooling solid body, the high thermal conductive fluid is drawn out of the grooves. Generally, since the high thermal conductive fluid e.g. the high thermal conductive grease or a high thermal conductive adhesive is able to wet and spread over the surface of a solid only with difficulty, the contact angle of the high thermal conductive fluid exceeds 90° and a gas-liquid interface of the high thermal conductive fluid which has been pushed into the grooves defines a convex surface. The pressure $P_1$ of the high thermal conductive fluid in the grooves which provides the convex interface is higher by $\sigma/r$, where $\sigma$ represents the surface tension of the high heat conductive fluid and r represents the radius of curvature of the convex interface, than the pressure Pa of a surrounding air. Thus, since the pressure of the in-groove high thermal conductive fluid is higher than the pressure of the surrounding air, the in-groove high thermal conductive fluid flows out of the grooves into space between the opposite heat transfer surfaces as the heat transfer surfaces separate from each other. Concurrently, the gas-liquid interface of the high thermal conductive fluid begins to deform and air enters the layer of the high thermal conductive fluid. Once air has entered the layer, the layer, which has the narrow width between the adjacent grooves, is readily divided. As the number of the defined grooves increases, the lengths of fluid interfaces in contact with the surfaces of the grooves, i.e., the so-called lengths of wetted perimeter, very increase. Thus, the probability of the occurrence of breaking the fluid interfaces is high. In addition, the contact area of the grooved heat transfer surface is small, so that a required separation force is small.

As described above, the electronic device is mounted to the cooling solid body and a continuously stable and low contact thermal resistance is secured under a small load which will damage neither the electronic device nor a connection to the electronic device. On the other hand, a small force can separate the electronic device and the cooling solid body from each other. Therefore, assembly, disassembly and maintenance of the assembly of the electronic device are easy.

Hereinafter, the embodiments of the present invention will be described in detail with reference to the drawings.

FIG. 1 illustrates the overall arrangement of a multichip module to which the present invention is applied. The multichip module 1 is so arranged that a ceramic package 4 hermetically seals and packages a ceramic multilayer interconnection substrate 3 with multiple microchip carriers 2 each containing LSI chips.

Figure 2:
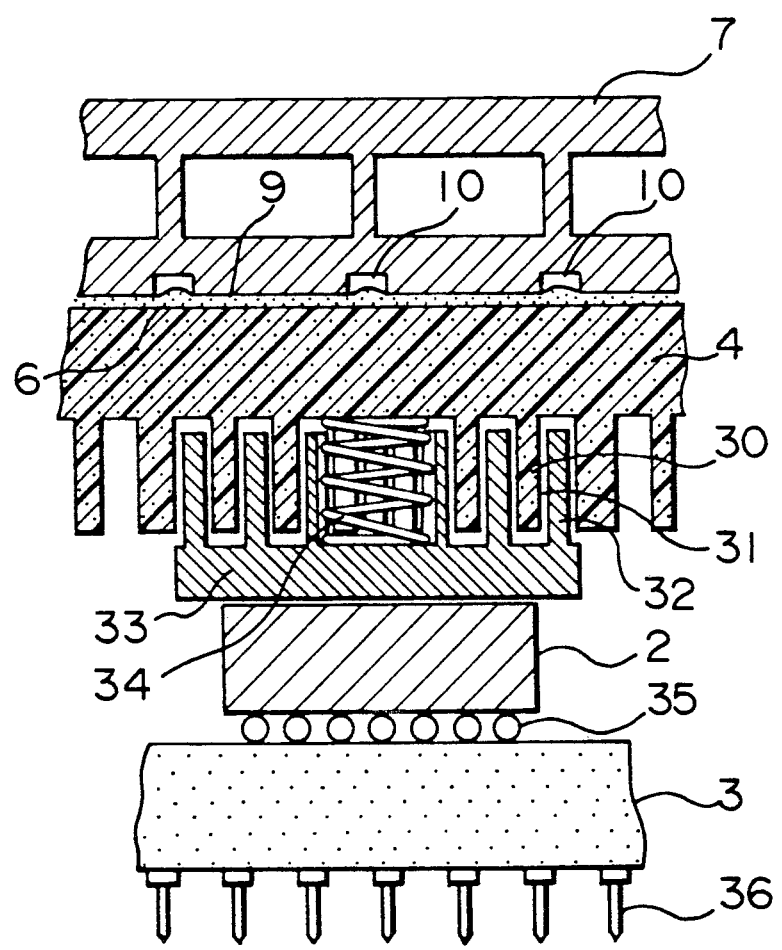
FIG. 2 is an enlarged detailed sectional view of an essential portion of a flexible thermal conductive contactor in FIG. 1.
Figure 3:
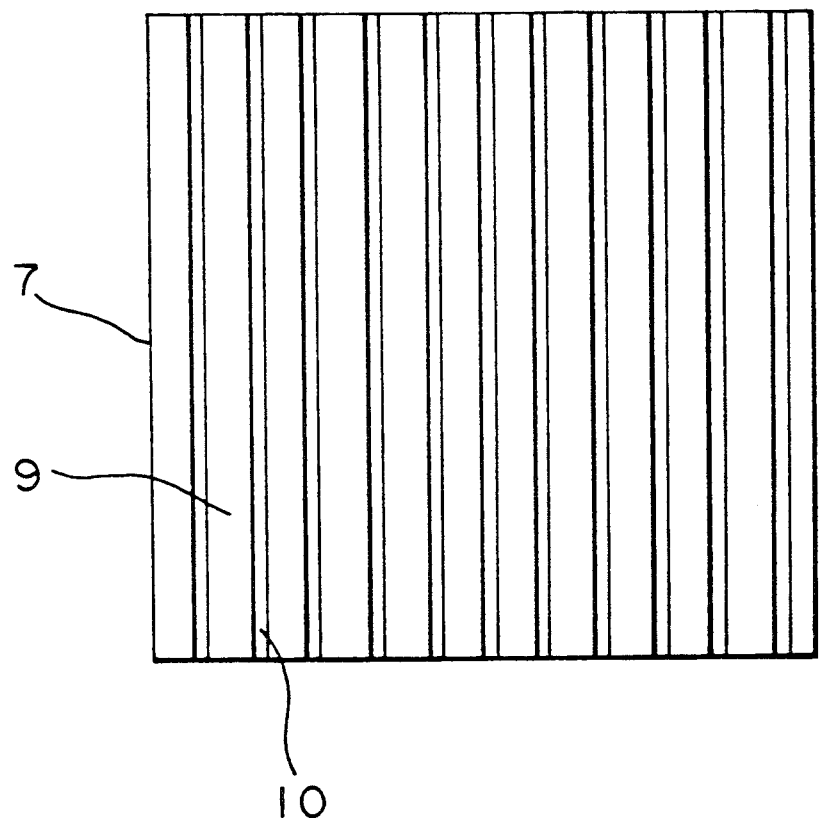
FIG. 3 is a bottom view of the water-cooled jacket in FIG. 1.

Heat produced by each LSI chip is transmitted through a flexible thermal conductive contactor 5 pressed on the back surface of each microchip carrier 2 to the ceramic package 4. As shown in FIG. 2, the flexible thermal conductive contactor 5 comprises; a number of flat fins 30 extending from an inner surface of the package 4; a solid thermal conductor 33 provided on each microchip carrier 2 and having fins 32 each fitting with corresponding fins 30 on the package 4 with microgaps 31; and a spring 34 pressing the solid thermal conductor 33 onto the microchip carrier 2. The microchip carrier 2 is facedown bonded through soldering microballs 35 to the top surface of the multilayer interconnection substrate 3 with alternating multiple conductive layers and insulating layers. The microchip carrier 2 is electrically connected to multiple pins 36 provided on the underside of the multilayer interconnection substrate 3. On the other hand, a water-cooled jacket (i.e. cooling solid body) 7 having an interior space through which a low-temperature cooling water passes is mounted by means of a metal clamp 8 to a cooled surface 6 of the ceramic package 4. As shown in FIG. 3, a heat transfer surface 9 of the water-cooled jacket 7 has multiple grooves 10 each communicating with the outside of the heat transfer surface 9. The cooled surface 6 of the package 4 and the heat transfer surface 9 of the water-cooled jacket 7 sandwich a layer of a high thermal conductive grease 11. Helium gas fills sealed space 37 defined between the multilayer interconnection substrate 3 and the package 4. Heat produced by the LSI chips is transmitted to the solid heat conductor 33 in contact with the microchip carrier 2 and in turn through the fins 32 of the solid thermal conductor 33 and layers made of helium gas in the microgaps 31 to the fins 30 provided on the package 4.

Heat received by the package 4 is transmitted from the heat transfer surface 6 thereof through the layer of the high thermal conductive grease 11 to the heat transfer surface 9 of the water-cooled jacket 7 and finally run away by a cooling water.

Figure 4A:
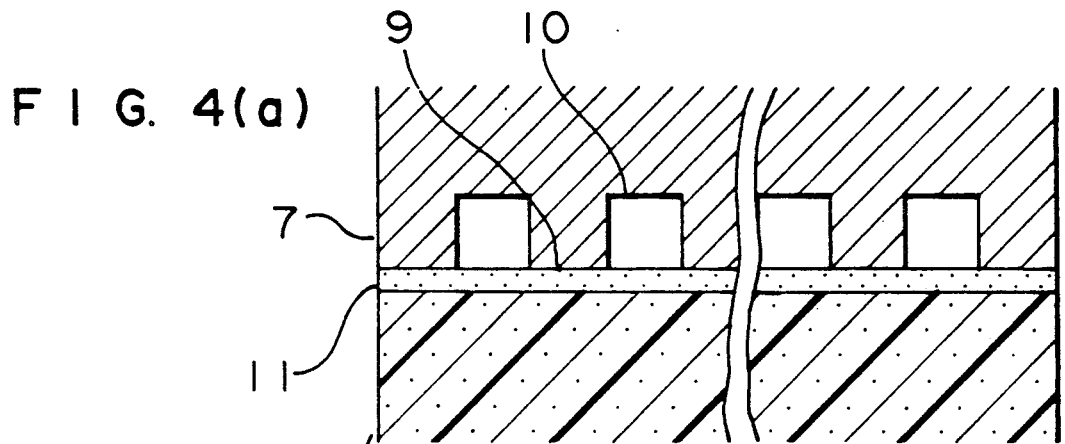
FIG. 4(a) is a sectional view of a condition of making the water-cooled jacket in close contact with the electronic device with a high thermal conductive grease sandwiched therebetween in the embodiment of FIG. 1.
Figure 4B:
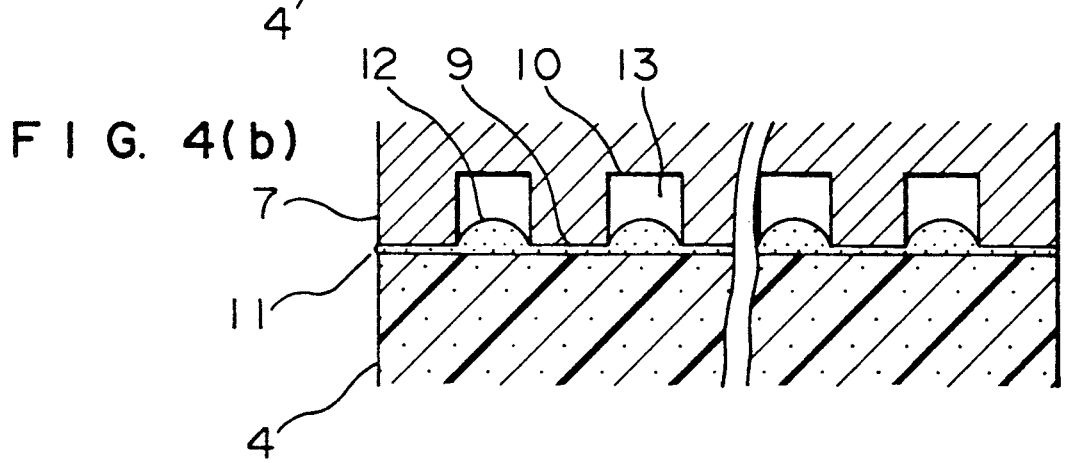
FIG. 4(b) is a sectional view of a condition of clamping the water-cooled jacket and the electronic device with the high thermal conductive grease sandwiched therebetween in the embodiment of FIG. 1.
Figure 4C:
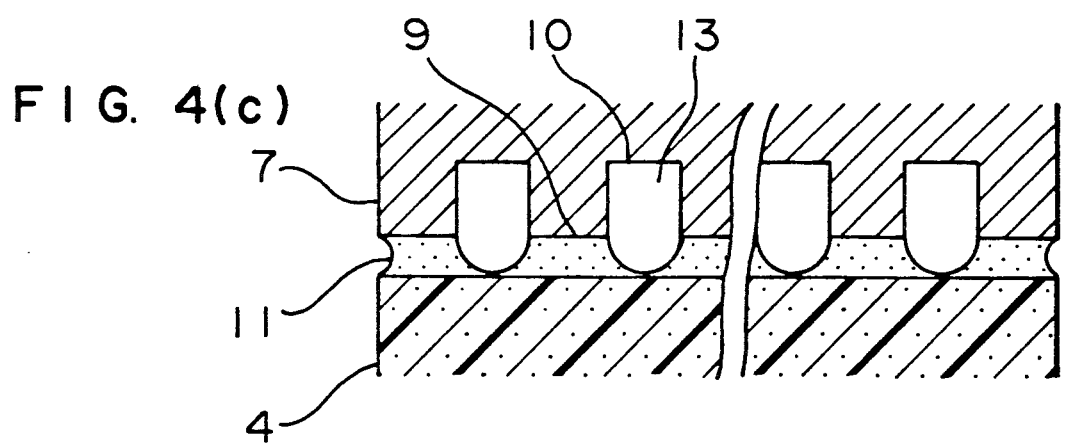
FIG. 4(c) is a sectional view of a condition of separating the water-cooled jacket from the electronic device with the high thermal conductive grease sandwiched therebetween in the embodiment of FIG. 1.

FIG. 4(a) illustrates a condition in which the high thermal conductive grease 11 is applied to the heat transfer surface 6 of the package 4 of the multichip module 1 and then the heat transfer surface 9 with the multiple grooves 10 of the water-cooled jacket 7 is simply in close contact with the layer of the high thermal conductive grease 11. FIG. 4(b) illustrates a condition in which then, the package 4 and the watercooled jacket are compressed. FIG. 4(c) illustrates a condition in which the water-cooled jacket 7 is being separated from the package 4. In the condition of FIG. 4(a), portions of the heat transfer surface 9 of the water-cooled jacket 7 except the grooves 10 are in contact with the surface of the layer of the high thermal conductive grease 11 essentially uniformly applied to in FIG. 4(b), as the metal clamp 8 begins to press the water-cooled jacket 7 to the package 4 in FIG. 4(a), heat transfer surface portions between adjacent grooves 10 enter the layer of the high thermal conductive grease 11 so that the high thermal conductive grease 11 swells into the adjacent grooves 10 to define convex gas-liquid interfaces 12. Since the high thermal conductive grease 11 is able to wet and spread over the surface of a solid only with difficulty, the gas-liquid interface of the high thermal conductive grease 11 is convex. In this case, when the breadth between the adjacent grooves 10 is adequately narrow and some of the high thermal conductive grease 11 swelling into each groove 10 does not fill all of the groove 10 so as to leave space 13 in contact with the bottom of the groove 10 and communicating with the outside of the grooves 10, the layer of the high thermal conductive grease 11 sandwiched between the water-cooled jacket 7 and the package 4 is very thin even when a pressing force of the water-cooled jacket 7 is small. Even if when the heat transfer surface 9 of the water-cooled jacket 7 is made in contact with the layer of the high thermal conductive grease 11 bubbles are entrained into the layer of the high thermal conductive grease 11 or the high thermal conductive grease 11 poorly wets the heat transfer surface 9, the high thermal conductive grease 11 well wets the heat transfer surface 9 and the bubbles are able to easily escape out of the grooves 10 as the layer of the high thermal conductive grease 11 swells into the grooves 10. Thus, the contact thermal resistance between the water-cooled jacket 7 and the package 4 is maintained low and stable.

When the package 4 fails, or is maintained or checked, the water-cooled jacket 7 must be separated from the package 4. Also in this case, the provision of the grooves in the heat transfer surface allows a small force to separate the water-cooled jacket 7 from the package 4. That is, in the contact condition of FIG. 4(b), the in-groove gas-liquid interface of the high thermal conductive grease 11 is convex so that the internal pressure of the high thermal conductive grease 11 is higher by $\sigma/r$, where $\sigma$ represents the surface tension of the high thermal conductive grease 11 and r represents the radius of curvature of the convex gas-liquid interface, than the pressure of an atmosphere surrounding the layer of the high thermal conductive grease 11. Therefore, as an external force begins to separate the water-cooled jacket 7 from the package 4, the in-groove high thermal conductive grease 11 easily begins to flow out of the grooves 10 into the gaps between the portions of the heat transfer surface 9 and the package 4. As shown in FIG. 4(c), the in-groove high thermal conductive grease 11 is drawn out and each of the in-groove gas-liquid interfaces of the high thermal conductive grease 11 becomes concave. However, the high thermal conductive grease 11 is able to wet and spread over the surface or a solid only with difficulty, so that the gas-liquid interfaces of the high thermal conductive grease 11 which has been drawn out do not necessarily provide uniform surfaces but provide irregular surfaces. Air enters the layer of the high thermal conductive grease 11 through the irregular portions of the gas-liquid interfaces. Once air enters, the layer of the high thermal conductive grease 11 is easily separated since the groove pitch or breadth between adjacent grooves is narrow. In particular, as the number of the grooves 10 increases, the breadth between adjacent grooves 10 in which corresponding portions of the heat transfer surfaces 6 and 9 are in contact with each other is narrow and irregular wetting portions increase. Thus, the small force easily separates the water-cooled jacket 7 from the package 4 without damaging the package 4.

The water-cooled jacket of the above embodiment has the grooves. However, the package may alternatively have the grooves. A high thermal conductive adhesive also produces a similar operation of the high thermal conductive grease.

Figure 5:
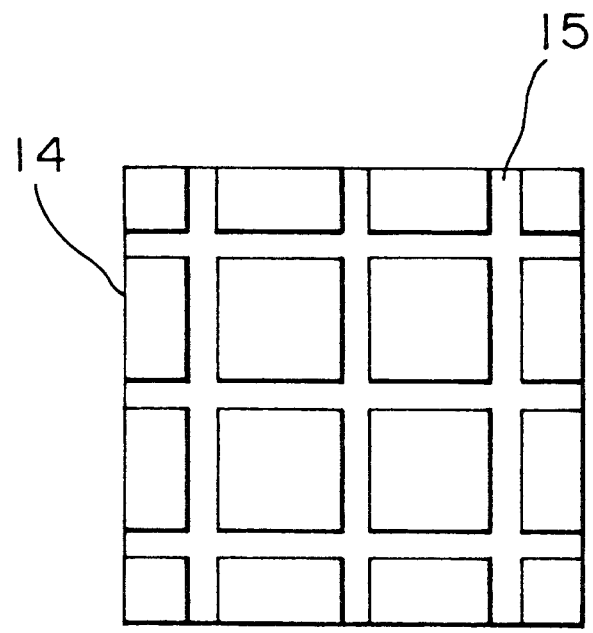
FIGS. 5, 6 and 7 are bottom views of other embodiments of the water-cooled jacket, respectively.

FIG. 5 illustrates an embodiment in which a heat transfer surface of a water-cooled jacket 14 defines grid-shaped grooves 15. In summary, the pattern of arranging the grooves 15 is optional whenever each of the grooves 15 communicates with the outside of the grooves 15.

Figure 6:
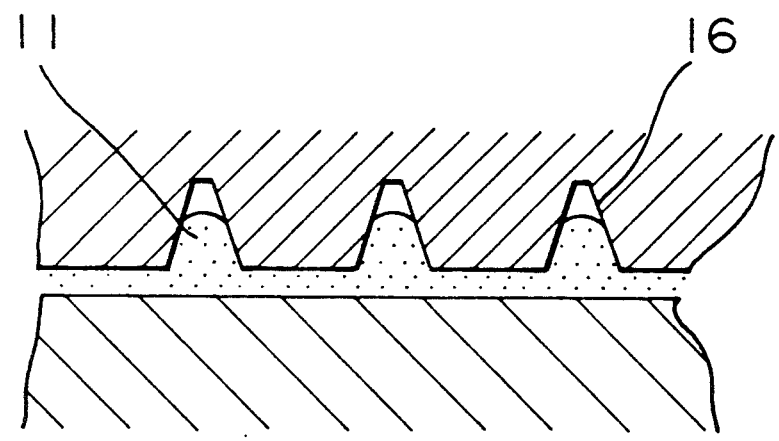

FIG. 6 illustrates an embodiment in which the cross-section of each of the grooves 16 in the heat transfer surface tapers to the narrow bottom of the groove 16. As the high thermal conductive grease 11 deeply enters the groove 16, the radius of curvature of a convex gas-liquid interface of the high thermal conductive grease 11 decreases, so that if the high thermal conductive grease 11 would excessively enter one groove 16, the internal pressure of a portion of the high thermal conductive grease 11 entering the one groove 16 would be higher than that of a portion of the high thermal conductive grease 11 entering an adjacent groove 16. Consequently, an excessive swelling of the high thermal conductive grease 11 into the one groove 16 is restrained, so that the tapering section of each of the grooves 16 has the function of automatically uniformly adjusting the volume of a portion of the high thermal conductive grease 11 entering each groove 16.

Figure 7:
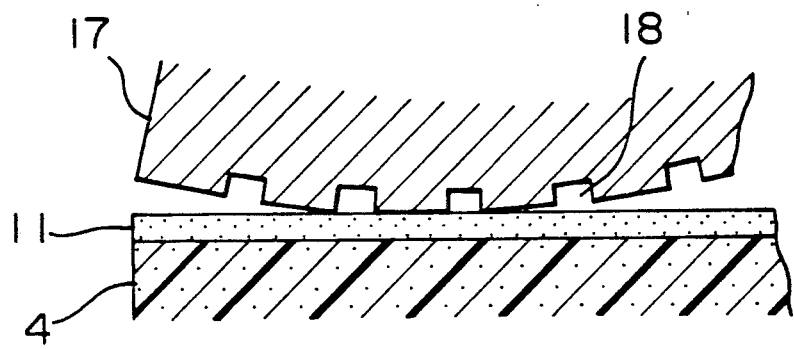

FIG. 7 illustrates an embodiment in which a spherical heat transfer surface, instead of the flat heat transfer surface, of a water-cooled jacket 17 defines multiple grooves 18. Thus, even if a heat transfer surface of a package opposite to the spherical heat transfer surface will be curved corresponding to the spherical heat transfer surface of the water-cooled jacket so as to be placed in close contact with a flat transfer surface of a water-cooled jacket only with difficulty, a clamping jig presses a periphery of the spherical heat transfer surface of the water-cooled jacket 17 on the curved heat transfer surface of the package so that the opposite heat transfer surfaces is well in close contact with each other.

The following tests were carried out in order to confirm a pressing effect and a separation effect of the inventive apparatus in FIG. 1: Four kinds of copper water-cooled jacket were combined with a ceramic package having a flat surface. A water-cooled jacket A had a flat grooveless surface. A water-cooled jacket B had a surface with 13 grooves, each groove having a 1-mm width, a groove pitch being 6 mm. A water-cooled jacket C had a surface with 19 grooves, each groove having a 1-mm width, a groove pitch being 4 mm. A water-cooled jacket D had a surface with 51 grooves, each groove having a 0.5-mm width, a groove pitch being 1.5 mm. Each of the watercooled jackets A to D was 100-mm square. Each of the grooves in the water-cooled jackets A to D was 0.5-mm deep. A layer of the high thermal conductive grease applied to the package was 20 μm to 100 μm thick.

Figure 8:
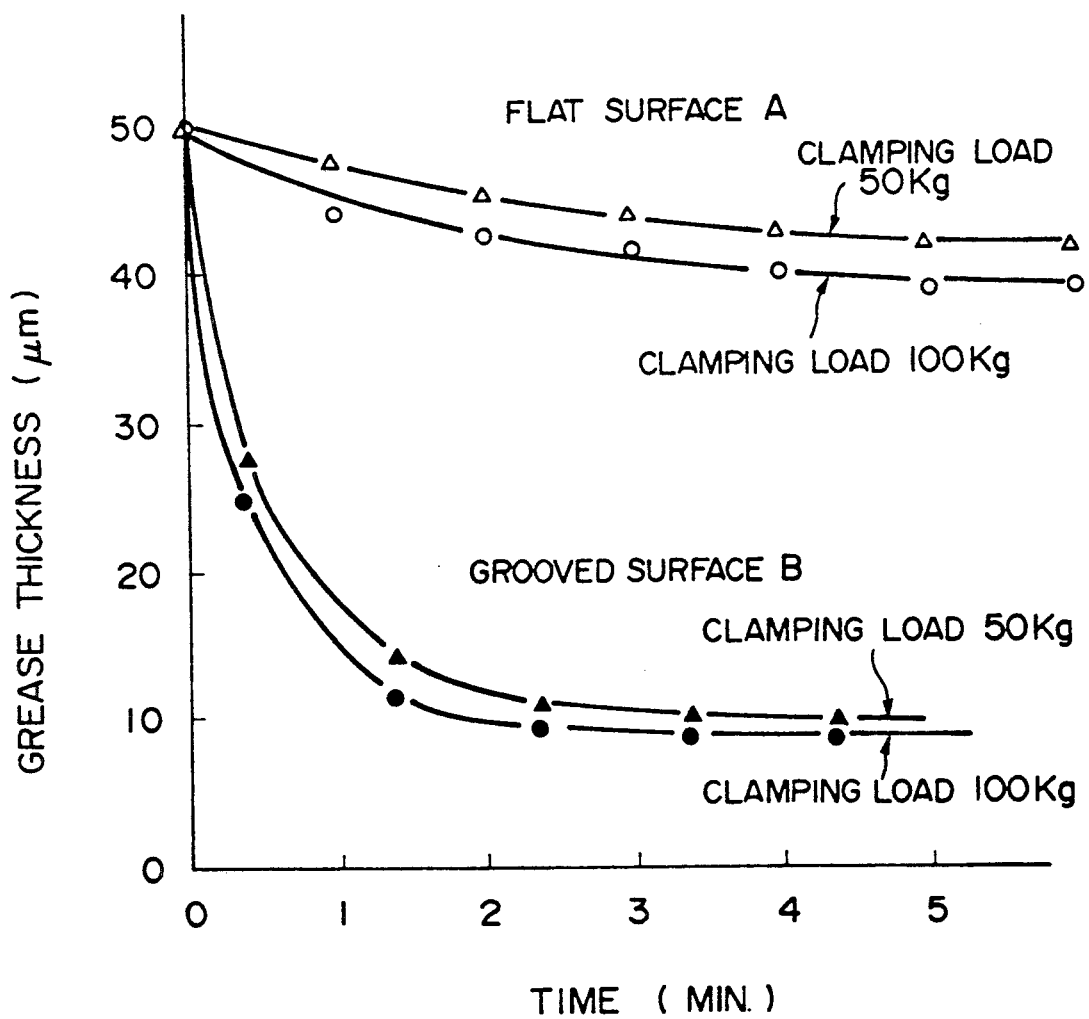
FIG. 8 is a diagram showing the results of pressing tests in the embodiments of the present invention.

FIG. 8 illustrates data of changes in thickness in layers of the applied high thermal conductive grease caused with passage of time when the water-cooled jackets A and B are pressed through the layers of the applied high thermal conductive grease on an electronic device. The water-cooled jackets A and B were employed. The high thermal conductive grease were applied by means of a mask with a 50-μm thickness to the water-cooled jackets A and B. Clamping loads were 50 kg and 100 kg. The diagram in FIG. 8 illustrates the thicknesses of the layers of the high thermal conductive grease measured by a gap sensor after a clamping of each of the watercooled jackets and the electronic device. As shown in FIG. 8, the thickness of the high thermal conductive grease applied to the grooved water-cooled jacket B is more rapidly reduced than that of the high thermal conductive grease applied to the grooveless water-cooled jacket A.

The following Table 1 shows the separating loads required when the separation tests were carried out on the water-cooled jackets A to D. Table 1 teaches that a water-cooled jacket with more multiple grooves requires less a separating load. The layer thickness of the high thermal conductive grease does not affect this tendency.

TABLE 1

| Heat transfer surface Thickness of grease layer | 20 (μm) | 50 (μm) | 100 (μm) |
|---|---|---|---|
| A | 27.4 (kg) | 20.4 (kg) | 19.0 (kg) |
| B | 6.7 | 5.4 | 4.5 |

TABLE 1-continued

| Heat transfer surface Thickness of grease layer | 20 (μm) | 50 (μm) | 100 (μm) |
|---|---|---|---|
| C | 4.3 | 3.6 | 3.5 |
| D | 2.4 | 2.3 | 1.9 |

The other embodiments of the water-cooled jacket by which the pressing and separating operations are more easily carried out will be described hereinafter. A heat transfer surface of each of these embodiments of the water-cooled jacket of FIGS. 9 to 12 has multiple grooves each of which does not pass through the outer periphery of the water-cooled jacket. The center of the heat transfer surface has a hole extending through the thickness of the water-cooled jacket and communicating with all the grooves.

Figure 9:
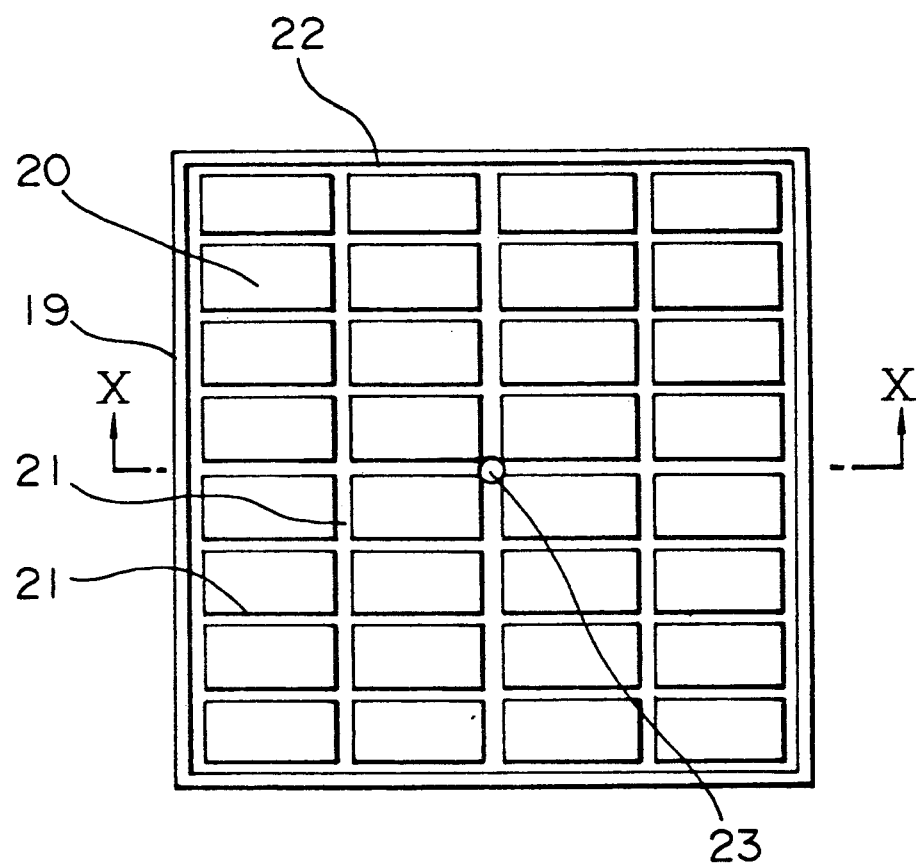
FIG. 9 is a bottom view of a further embodiment of the water-cooled jacket.
Figure 10:
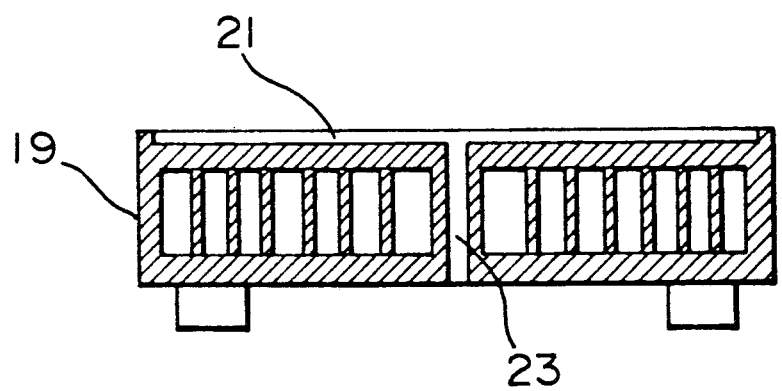
FIG. 10 is a sectional view taken along the line X—X in FIG. 9.

As shown in FIGS. 9 and 10, multiple grooves 21 arranged in the form of grid on a heat transfer surface 20 of a water-cooled jacket 19 communicate with a peripheral continuous groove 22 extending along the outer periphery of the heat transfer surface 20 so as not to pass through the outer periphery of the heat transfer surface 20. Thus, the multiple grooves 21 and the peripheral groove 22 communicate with a through-hole 23 defined at the center of the water-cooled jacket 19 and extending through the thickness of the water-cooled jacket 19. The heat transfer surface 20 with the grooves 21 and 22 is in close contact with and somewhat pressed on a layer of the high thermal conductive grease, and then a vacuum pump or the like draws air out of the grooves 21 and 22 through the through-hole 23, so that a pressure differential between the outside and inside of the grooves 21 and 22 easily presses the water-cooled jacket on the electronic device. On the other hand, when the water-cooled jacket is separated from the electronic device, feeding compressed air through the through-hole 23 into the grooves 21 and 22 pressurizes the interiors of the grooves 21 and 22, so that the water-cooled jacket is readily separated from the electronic device without a need for an additional external force. In this case, the compressed air serves to separate the water-cooled jacket from the package and divide the layer of the high thermal conductive grease. Also, the peripheral groove 22 accomplishes a port of a stopper that the high thermal conductive grease does not protrude from the both outside of the water-cooled jacket and the package.

Figure 11:
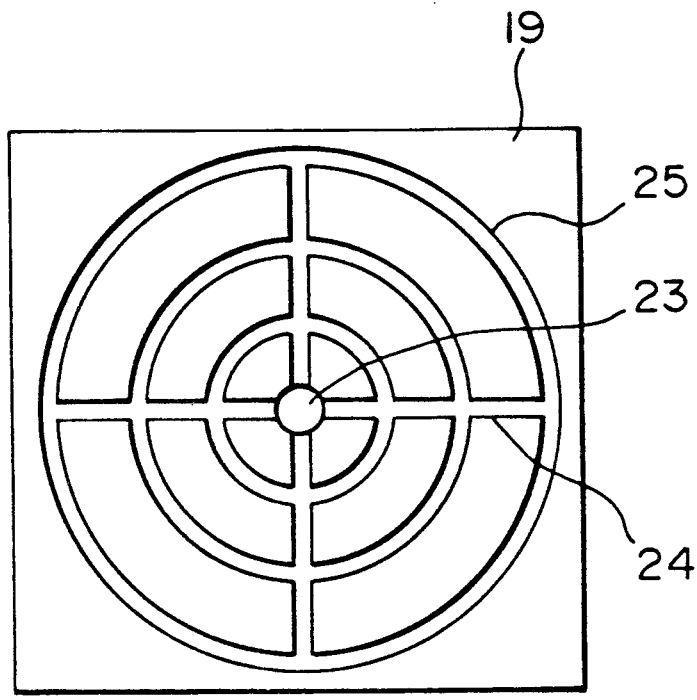
FIG. 11 is a bottom view of a still further embodiment of the water-cooled jacket.
Figure 12:
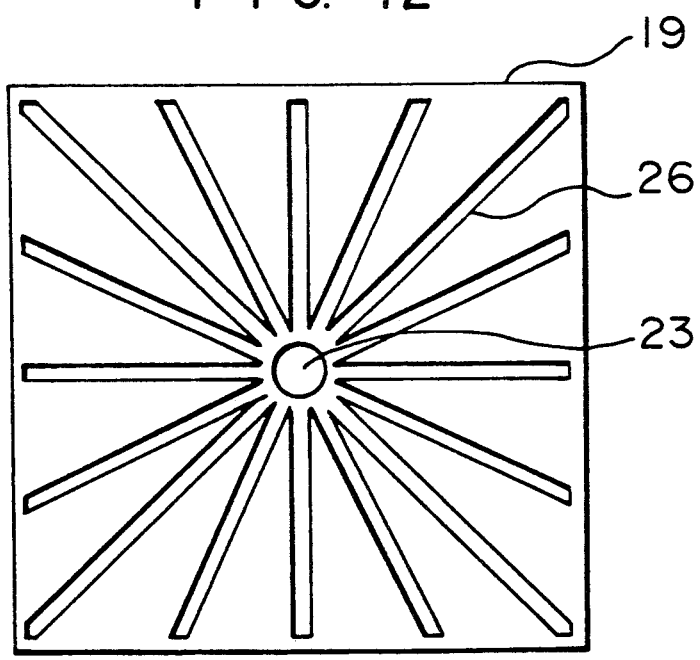
FIG. 12 is a bottom view of an yet further embodiment of the water-cooled jacket.

FIGS. 11 and 12 illustrate other embodiments of the water-cooled jacket similar to the embodiment of FIGS. 9 and 10. The water-cooled jacket of FIG. 11 has radially extending grooves 24 and annular concentric grooves 25 crossing the radially extending grooves 24. The water-cooled jacket of FIG. 12 has multiple radially extending grooves 26. All the above embodiments of the present invention have employed water as a coolant. However, the coolant may alternatively be air or the like.

In accordance with the present invention, when a cooling solid body is pressed through a layer of a high thermal conductive liquid which is hard to wet and spread over the surface of a solid on an electronic device e.g. an LSI chip itself, micro-chip carrier containing an LSI chip or multichip module containing the LSI chip and microchip carrier, so as to cool the electronic device, a small force can cause the cooling solid body to be in close contact with the electronic device. Thus, the electronic device and a connection to the electronic device will not experience a damage, and a contact heat resistance between the cooling solid body and electronic device can be maintained low and stable. On the other hand, a small force can separate the cooling solid body from the electronic device, so that the electronic device will experience neither a damage nor deformation. A simplified arrangement of assembly and disassembly produces advantages in that a cost is reduced and a working efficiency is improved.

What is claimed is:

1. A cooling apparatus for an electronic device, the cooling apparatus comprising;
   an electronic device;
   a cooling solid body for eliminating heat produced by said electronic device;
   a thermal conductive fluid having a high thermal conductivity sandwiched between a heat transfer surface of said electronic device and a heat transfer surface of said cooling solid body; and
   clamping means for forcing said heat transfer surface of said cooling solid body into close contact with said heat transfer surface of said electronic device,
   wherein the heat transfer surface of at least one of said electronic device and said cooling solid body having multiple grooves therein which communicate with a spacer surrounding at least one of said electronic device and said cooling solid body.

2. A cooling apparatus for an electronic device as recited in claim 1, wherein thermal conductive fluid comprises a fluid which is hard to wet and spread over the surface of a solid.

3. A cooling apparatus for an electronic device as recited in claim 2, whereon the thermal conducive fluid comprises grease or a thermal conductive adhesive.

4. A cooling apparatus for an electronic device as recited in claim 3, wherein the thermal conductive fluid comprises a high viscous grease.

5. A cooling apparatus for an electronic device as recited in claim 1, whereon the capacity of the grooves is larger than the volume of the thermal conductive fluid sandwiched between said electronic device and said cooling solid body between adjacent ones of the grooves so that space is left in each of the grooves when some of the thermal conducive fluid between the adjacent ones of the grooves enters the adjunct ones of the grooves.

6. A cooling apparatus for an electronic device, characterized in that the apparatus has an arrangement in which an external force urges a heat transfer surface of a cooling solid body into close contact with a heat transfer surface of the electronic device, between which transfer surfaces a thermal conductive fluid having a high thermal conductivity hardly wetting the surface of a solid is applied, so that said thermal conducive fluid is sandwiched between the heat transfer surface of said electronic device and the heat transfer surface of said cooling solid body and transfers heat to the cooling solid body to cool the electronic device; one of two heat transfer surfaces of the electronic device and the cooling solid body is flat, the other heat transfer surface is a grooved surface including flat heat transfer surface portions and multiple grooves defined between the flat heat transfer surface portions and communication with a space outside of the grooved heat transfer surface, and the capacity of each of the grooves is lager than the volume of a portion of the heat transfer fluid applied to a corresponding flat heat transfer surface portion between adjacent ones of the grooves.

7. A cooling apparatus for an electronic device as recited in claim 6, whereon the section of each of the grooves tapers from the open end of the groove provided at a corresponding heat transfer surface portion of the cooling solid body to the narrow bottom of the groove.

8. A cooling apparatus for an electronic device as recited in claim 6, wherein all the grooves communicate with one another.

9. A cooling apparatus for an electronic device as recited in claim 8, wherein the cooling solid body includes a through-hole extending from the heat transfer surface to the opposite surface of the cooling solid body, each of the grooves communicates with the through-hole so as to open to the outside of the cooling solid body.

10. A cooling apparatus for an electronic device as recited in claim 6, the electronic device comprises a multichip module with a high thermal conductive ceramic package.

11. A cooling apparatus for an electronic device, comprising:
    a cooling solid body with a heat transfer surface in close contact through a thermal conductive fluid having a high thermal conductivity and low viscosity with a heat transfer surface of an electronic device;
    at least one of said heat transfer surfaces of the electronic device and said cooling solid body having multiple grooves communicating with the outside of the one heat transfer surface, the capacity of the grooves being greater than the volume of a thermal conductive fluid sandwiched between the heat transfer surfaces so that each of the grooves leaves therein space communication longitudinally with the outside of the one heat transfer surface when the thermal conductive fluid is received within the grooves.

12. A cooling apparatus for an electronic device as recited in claim 11, wherein the thermal conductive fluid comprises grease or a thermal conductive adhesive.

13. A cooling apparatus for an electronic device, comprising:
    an electronic device to be cooled;
    a thermal conductive fluid having a low viscosity provided on a heat transfer portion of said electronic device; and
    a cooling solid body having a portion in close contact through said thermal conductive fluid with the heat transfer portion of said electronic device, the close contact portion of said cooling solid body having a multiple grooves open longitudinally to the outside of said cooling solid body.

14. A cooling apparatus for an electronic device as recited in claim 13, whereon h capacity of each of the grooves is larger than the volume of the thermal conductive fluid sandwiched between said electronic device and said cooling solid body between corresponding adjacent ones of the grooves so that space is left in each of the adjacent ones of the grooves when a portion of the thermal conductive fluid between the adjacent ones of the grooves enters the adjacent ones of the grooves.

15. A cooling apparatus for an electronic device, comprising:
    an electronic device in the form of a package which contains a plurality of semiconductor chips;

a cooling solid body for eliminating heat produced by said electronic device;

a thermal conductive fluid with a high thermal conductivity and low viscosity sandwiched between an overall hat transfer surface of said electronic device and a heat transfer surface of said cooling solid body, one of the heat transfer surfaces of said electronic device and said cooling solid body being provided with a plruality of grooves in contact with said thermal conductive fluid; and clamping means for forcing the heat transfer surface of said cooling solid body into close contact with the overall heat transfer surface of said electronic device.

16. A cooling apparatus for an electronic device, comprising:

a multichip module in which a ceramic package is hermetically sealed to a ceramic multilayer interconnection substrate so as to enclose multiple LSI chips packaged on said substrate, and flexible thermal conductive contractors disposed between said chips and said package to transmit heat produced by the LSI chips to the ceramic package;

a water-cooled jacket with a heat transfer surface in close contact through a thermal conductive fluid having a high thermal conductivity and a low viscosity with an overall outer heat transfer surface of the multichip module; and means for forcing said portion of the watercooled jacket into close contact with the overall outer heat transfer surface of the multichip module in order to sandwich a thin layer of thermal conductive fluid between the watercooled jacket and the multichip module.

17. A cooling apparatus for an electronic device as recited in claim 16, wherein the thermal conductive fluid comprises grease.

* * * * *